(12) United States Patent
Moliere

(10) Patent No.: US 7,076,215 B1
(45) Date of Patent: Jul. 11, 2006

(54) TRANSMITTER-RECEIVER

(75) Inventor: Thomas Moliere, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/936,290

(22) PCT Filed: Mar. 1, 2000

(86) PCT No.: PCT/DE00/00614

§ 371 (c)(1),
(2), (4) Date: Dec. 28, 2001

(87) PCT Pub. No.: WO00/55981

PCT Pub. Date: Sep. 21, 2000

(30) Foreign Application Priority Data

Dec. 3, 1999 (DE) ................................ 199 11 147

(51) Int. Cl.
*H04B 1/40* (2006.01)
(52) U.S. Cl. .......................................... 455/77; 455/87
(58) Field of Classification Search .................. 455/73, 455/77, 180.3, 181.1, 182.1, 182.2, 182.3, 455/183.1, 183.2, 192.1, 192.2, 192.3, 255, 455/256, 257, 258, 259, 260, 261, 262, 263, 455/264, 265
See application file for complete search history.

(56) References Cited

U.S. PATENT DOCUMENTS 5,291,474 A 3/1994 Ikonen et al.
6,246,867 B1 * 6/2001 Jakobsson .................... 455/324
6,321,075 B1 * 11/2001 Butterfield ................... 455/313
6,329,847 B1 * 12/2001 Chabas ........................... 327/3
6,564,039 B1 * 5/2003 Meador et al. ............... 455/76
6,741,449 B1 * 5/2004 Pasternak .................... 361/303

FOREIGN PATENT DOCUMENTS

EP 0 535 800 A2 4/1993

OTHER PUBLICATIONS

"Delta-Sigma Modulation in Fractional-N Frequency Synthesis" by Riley et al.; IEEE Journal of Solid-State Circuits, vol. 28, No. 5, May 1993.

* cited by examiner

*Primary Examiner*—Fan Tsang
*Assistant Examiner*—Matthew Genack
(74) *Attorney, Agent, or Firm*—Morrison & Foerster LLP

(57) ABSTRACT

A transceiver having an RF receiver, in particular VHF receiver, with digital signal processing in a digital part. The transceiver having an input part, at least one mixer and an intermediate frequency/baseband processing device, having a local channel oscillator, to which a first phase locked loop with a phase discriminator and an adjustable first frequency converter are assigned, and having a reference oscillator for the phase locked loop and the control clock of the digital signal processing device, in which, in order to acquire the control clock, a digital clock synthesizer is provided to which an output signal of the reference oscillator is supplied, and a control signal is supplied by the digital part in the form of a digital tuning word, the frequency of the reference oscillator being selected such that its order of magnitude is at least equal to the bandwidth of one or more of the reception bands used, and none of its harmonics occur in a reception channel.

10 Claims, 1 Drawing Sheet

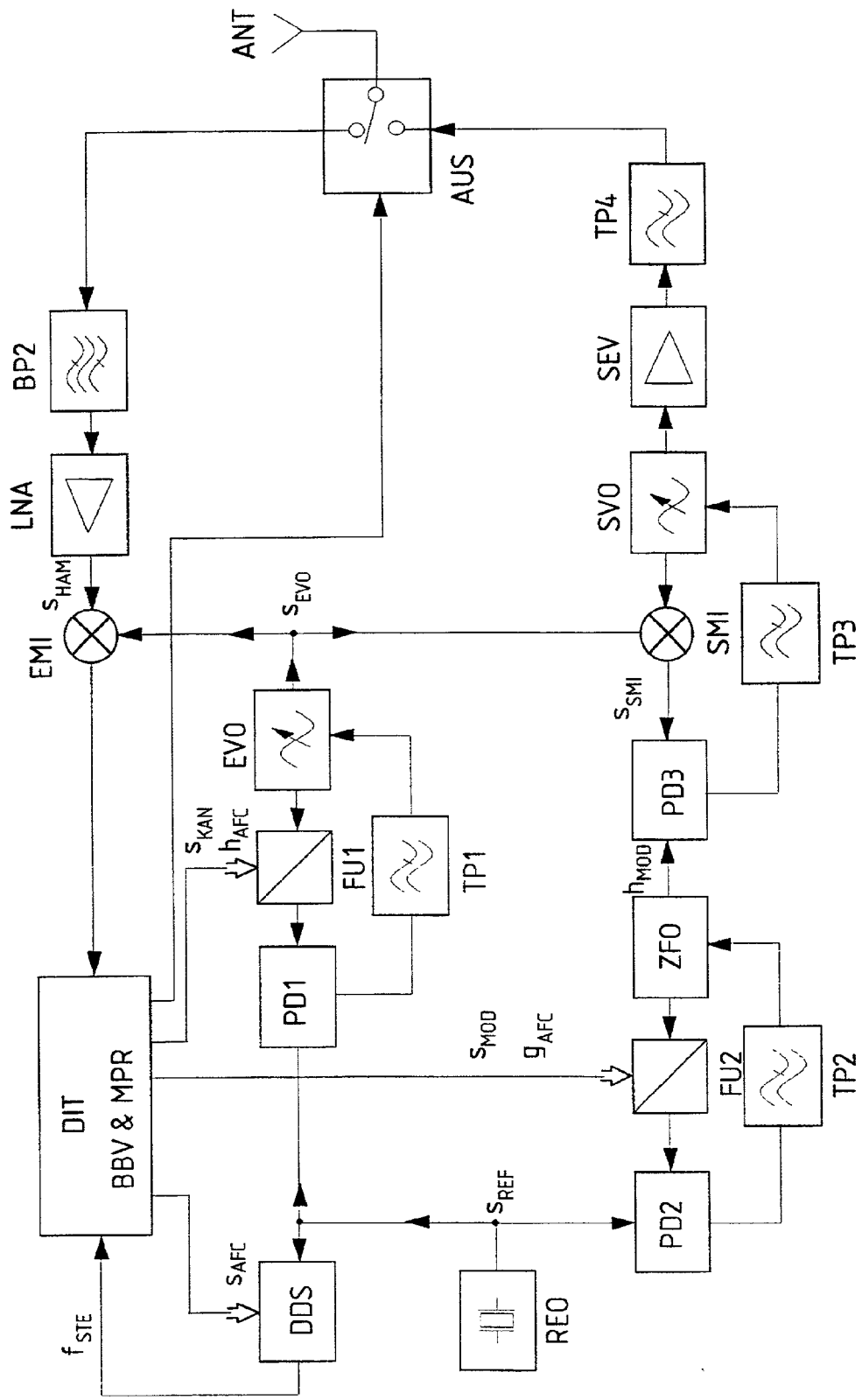

TRANSMITTER-RECEIVER

CLAIM FOR PRIORITY

This application claims priority to International Application No. PCT/DE00/00614 which was published in the German language on Sep. 21, 2000.

TECHNICAL FIELD OF THE INVENTION

The invention relates to a transceiver having an RF receiver, and in particular, to a transceiver having a UHF receiver.

BACKGROUND OF THE INVENTION

In many radios, and in particular in radio telephones, the clock oscillator is a crystal oscillator with a relatively low frequency whose harmonics can occur in the reception band of the receiver.

GSM devices operate, for example, in the 900 MHz band. In conventional embodiments, the receiver has an intermediate frequency of 45–400 MHz and the transmitter operates with direct modulation of a carrier which is generated on the transmission frequency. A channel oscillator and a fixed frequency oscillator both use a 13 MHz crystal oscillator as a reference. The frequency of 13 MHz is used because the clock frequency which is required centrally by the GSM digital part relates to 13 MHz with 13/6=2.1666 MHz, and the channel raster frequency of 200 kHz, which is equal to the comparison frequency of the channel synthesizer, is also derived from it by simple frequency division. 13 MHz is thus the lowest possible reference oscillator frequency of each conventional GSM telephone.

The seventy-second harmonic of the 13 MHz oscillator occurs in the 936 MHz reception channel, and the seventy-third harmonic occurs in the 949 MHz reception channel. In mobile phones which are highly miniaturized, the spatial proximity of the radio modules to the receiver input and to the antenna results in a particular problem. Current specifications prescribe that interference frequencies at the 50 ohm receiver input must be less than 0.7 micro volts, for example. A customary 13 MHz crystal oscillator oscillates at an amplitude of approximately 1 volt, which means that harmonics of this oscillator may appear damped by more than 120 dB in the 900 MHz region at the receiver input. However, the high-speed silicon transistors which are customary today give rise to upper harmonic intervals of only approximately 60 dB in relation to the useful carrier in the 900 MHz region. Additional damping between the crystal oscillator and the receiver input of approximately 60 dB is thus necessary. Given the small spatial distances between these regions of at most 40 mm, this gives rise to an extreme level of expenditure on shielding in customary GSM mobile phones, i.e. to the use of sheet metal parts, metal housing etc. Attempts at solving this harmonic problem by means of switching measures alone, for example by means of harmonic filters, have only been partially successful because the harmonics are generally reflected by them and not destroyed, which in an extreme case can even lead to a situation in which critical harmonics are irradiated in an amplified form.

SUMMARY OF THE INVENTION

In one embodiment of the invention, there is a transceiver. The transceiver includes, for example, an RF receiver with digital signal processing in a digital part with an input part, at least one mixer, and an intermediate frequency/baseband processing device having a local channel oscillator to which a first phase locked loop with a phase discriminator and an adjustable first frequency converter are assigned, and having a reference oscillator for the phase locked loop and the control clock of the digital signal processing device, wherein in order to acquire the control clock, a digital clock synthesizer is provided to which an upward signal of the reference oscillator is supplied, and a control signal is supplied by the digital part in the form of a digital tuning word, the frequency of the reference oscillator being selected such that its order of magnitude is at least equal to the bandwidth of one or more of the reception bands used and harmonics do not occur in a reception channel.

In another aspect of the invention, the clock synthesizer is a synthesizer with direct digital synthesis.

In another aspect of the invention, the first frequency converter is a DDS synthesizer or a fractional N divider with a sigma-delta modulator.

In yet another aspect of the invention, a fine-tuning signal is supplied to the first frequency converter by the digital part.

In another aspect of the invention, there is an IF oscillator to which a second phase locked loop with a phase discriminator and a second frequency converter is assigned, an output signal of the reference oscillator being supplied to the phase discriminator, and a modulation signal and a fine-tuning signal being supplied to the frequency converter by the digital part.

In yet another aspect of the invention, the frequency converter assigned to the IF oscillator is a DDS synthesizer or a fractional N divider with sigma-delta modulator.

In still another aspect of the invention, the modulation signal is supplied to the IF oscillator frequency converter from the digital part.

In yet another aspect of the invention, the modulated IF signal is generated using frequency conversion, frequency division or DDS.

In another aspect of the invention, the transceiver is a homodyne receiver in which the modulated RF carrier, and a direct or rearranged output signal of the local channel oscillator are supplied to a reception mixer so that the intermediate frequency corresponds to the baseband.

In still another aspect of the invention, the modulated output signal of the IF oscillator and the output signal of a transmission mixer are fed to a phase discriminator, to which a signal of a controlled transmission oscillator and an output signal of the local channel oscillator are supplied.

BRIEF DESCRIPTION OF THE DRAWINGS

The invention, together with further advantages, is explained in more detail below with reference to an exemplary embodiment which is illustrated in the drawing.

FIG. 1 shows a basic, simplified block diagram of a transceiver according to the invention.

DETAILED DESCRIPTION OF THE PREFERRED EMBODIMENTS

The invention discloses a transceiver having an RF receiver, and in particular, to a transciever having a UHF receiver, with a digital signal processing device in a digital part, with an input part, at least one mixer and an intermediate frequency/baseband processing means, and having a local channel oscillator to which a first phase locked loop with a phase discriminator and an adjustable first frequency converter are assigned, and having a reference oscillator for the phase locked loop and the control clock of the digital signal processing device.

The invention provides a transceiver in which the aforesaid problem with harmonics of the reference oscillator is solved to the effect that costs, volume and weight of the device are reduced by eliminating or decreasing the expenditure on shielding.

This is achieved with a transceiver according to the invention. In order to acquire the control clock, a digital clock synthesizer is provided to which an output signal of the reference oscillator and a control signal are fed from the digital part in the form of a digital tuning word, the frequency of the reference oscillator being selected such that its order of magnitude is at least equal to the bandwidth of one or more of the reception bands used, and harmonics do not occur in a reception channel.

The invention prevents harmonics occurring in a reception channel, with the result that the shielding between the transmitter part and receiver part can be significantly reduced.

In one embodiment, the clock synthesizer is embodied as a synthesizer with direct digital synthesis because as a result any frequency can be generated from any other frequency, and the frequency can also be finely adjusted.

A further embodiment has a first frequency converter which is a fractional N divider with a sigma-delta modulator. This embodiment provides the advantage that it permits high-speed channel changes, fine-tuning and good phase changing values with high comparison frequencies even with a conventional structure.

A fine-tuning signal is advantageously supplied to the first frequency converter by the digital part, as a result of which a cheaper reference oscillator can be used which does not require any fine tuning. In principle, a fine-tuning signal can advantageously be supplied to all the frequency converters used.

Another embodiment of the invention is defined in that an IF oscillator is provided to which a second phase locked loop with a phase discriminator and a second frequency converter is assigned, an output signal of the reference oscillator being supplied to the frequency discriminator, and a modulation signal and a fine-tuning signal being supplied to the frequency converter. As a result, a modulated signal can be advantageously conditioned. It may be advantageous here if a GMSK modulation signal of a finely adjustable sigma-delta synthesizer is supplied to the IF oscillator.

The invention permits the use of both the conventional heterodyne receiver and of a homodyne receiver in which the modulated RF reception signal and an output signal, in each case with the latter's frequency, of the channel synthesizer are fed to a reception mixer so that the intermediate frequency corresponds to the baseband.

A simple and cost-effective connection between the transmitter and receiver is obtained if the modulated output signal of the IF oscillator and the output signal of a transmission mixer are fed to a phase discriminator to which a signal of a controlled transmission oscillator and an output signal of the local channel oscillator are fed.

According to FIG. 1, a transceiver according to the invention includes a controller MPR and a baseband processing device BBV, which are illustrated in a single block designated as digital part DIT. A reference oscillator REQ, which supplies an output signal $S_{REF}$ is provided in a known fashion, and the signal is then used in the way described below to acquire a control clock and to derive the channel frequencies necessary for the transceiver and transmitter.

The output signal $S_{REF}$ is then supplied to a digital synthesizer DDS, which expediently operates in accordance with digital direct synthesis. Such synthesizers are known, and a modem exemplary embodiment is described in the company literature CMOS, 125 MHz Complete DDS Synthesizer, AD 9850, Analog Devices, Inc. 1998, together with circuitry examples and functional explanations. In such a DDS synthesizer, any frequency can generate any desired other frequency, and fine adjustment is also possible using an AFC signal so that cheaper oscillators of any desired frequency, even ceramic oscillators or freewheeling oscillators, can be used as the reference oscillator. Reference oscillators have until now been one of the most expensive modules in radio telephones owing to the necessary precision and stability.

The synthesizer DDS supplies a control clock $f_{STE}$ to a micro controller of the digital part DIT, and receives from said block a control signal $S_{AFC}$, namely in the form of a digital tuning word, which both brings about the frequency conversion and the fine tuning to the precise clock frequency, which is carried out using a precise clock received from the base station, namely in the form of a digital tuning word. The output signal $S_{REF}$ of the reference oscillator REO is also fed to a phase lock loop which includes a first frequency converter FU1, a phase discriminator PD1, a low-pass filter, TP1 and a local channel oscillator EVO. The frequency converter FU1 is expediently embodied as a fractional N divider with sigma-delta modulator, and it receives a fine-tuning signal $h_{AFC}$ and a channel signal $S_{KAN}$ from the microprocessor block MPR, BBV. The output signal of the channel oscillator EVO is fed at the receiver end to a receiver mixer EMI. The radio-frequency signal SHAM is supplied to this receiver mixer, the radio-frequency signal SHAM passing via an antenna ANT with a controllable change-over switch AUS, a bandpass filter BP2 and a low-noise amplifier LNA. Mixing is expediently carried out directly into the baseband, in accordance with modem concepts, i.e. the frequency of the mixing oscillator signal corresponds precisely to the frequency of the radio-frequency signal $S_{HAM}$. The oscillator frequency at the mixer input can be the same as the direct frequency of the oscillator EVO, or equal to a frequency of the oscillator EVO which is converted, for example by means of a frequency converter. Receivers operating according to this principle are known as homodyn receivers. A detailed description of a signal-delta fractional N synthesizer can be found in "Delta-Sigma Modulation in Fractional-N Frequency Synthesis", EEE Journal of Solid-State Circuits, Vol. 28, No. 5, May 1993, pp 553–559.

At the transmitter end, the output signal $S_{EVO}$ of the channel oscillator EVO is fed to a transmitter mixer SMI. The transmitter mixer is contained in a phase locked loop which contains a controlled transmission oscillator SVO, a phase discriminator PD3 and a low-pass filter TP3, and a signal $h_{MOD}$ is also supplied to the (third) phase discriminator PD3, in addition to the output signal $S_{SMI}$.

The signal $h_{MOD}$ constitutes the modulated output signal of an IF oscillator ZFO, which is likewise included in a (second) phase locked loop which also includes a second frequency converter FU2, a second phase discriminator PD2 and a second low-pass filter TP2. A modulation signal $S_{MOD}$ and a fine-tuning signal $g_{afc}$ are fed to the frequency converter FU2 by the microprocessor and baseband blocks MPR, BBV, and the output signal of the frequency converter FU2 passes to an input of the phase discriminator PD2 whose other input is supplied with the output signal $S_{REF}$ of the reference oscillator REO.

When still at the transmitter end, an output signal of the controlled transmission oscillator SVO is finally supplied to a transmission amplifier SEV, and from here to the antenna change-over switch AUS or the antenna ANT via a low-pass filter TP4.

The invention is particularly suitable for transceivers in which the problems mentioned at the beginning in terms of the harmonics are significant. Practical embodiments have proven expedient for radio telephones which operate in the 900, 1800, 1900 and 2000 MHz ranges, and thus in the GSM 900, GSM 1800, GSM 1900 and IMT-2000 systems (UMTS). In what is referred to as multimode devices, it may be necessary to select a reference oscillator frequency whose harmonics occur in none of the reception bands used.

What is claimed is:

1. A transceiver, comprising:
    an RF receiver with a digital signal processing device in a digital part with an input part;
    at least one mixer; and
    an intermediate frequency and baseband processing device having a local channel oscillator to which a first phase locked loop with a phase discriminator and an adjustable first frequency converter are assigned, and having a reference oscillator for the first phase locked loop and a control clock of the digital signal processing device,
    wherein to acquire the control clock, a digital clock synthesizer is provided to which an upward signal of the reference oscillator is supplied, and a control signal is supplied by the digital part in the form of a digital tuning word, the frequency of the reference oscillator being selected such that its order of magnitude is at least equal to the bandwidth of one or more of the reception bands of said RF receiver used and harmonics do not occur in a reception channel.

2. The transceiver as claimed in claim 1, wherein the clock synthesizer is a synthesizer with direct digital synthesis.

3. The transceiver as claimed in claim 1, wherein the first frequency converter is a DDS synthesizer or a fractional N divider with a sigma-delta modulator.

4. The transceiver as claimed in claim 1, wherein a fine-tuning signal is supplied to the first frequency converter by the digital part.

5. The transceiver as claimed in claim 1, further comprising an IF oscillator to which a second phase locked loop with a phase discriminator and a second frequency converter is assigned, an output signal of the reference oscillator being supplied to the phase discriminator, and a modulation signal and a fine-tuning signal being supplied to the frequency converter by the digital part.

6. The transceiver as claimed in claim 5, wherein the frequency converter assigned to the IF oscillator is a DDS synthesizer or a fractional N divider with sigma-delta modulator.

7. The transceiver as claimed in claim 5, wherein the reference oscillator signal is supplied to the first frequency converter from the digital part.

8. The transceiver as claimed in claim 5, wherein the modulated IF signal is generated using frequency conversion, frequency division or DDS.

9. The transceiver as claimed in claim 1, wherein the transceiver is a homodyne receiver in which the modulated RF carrier, and a direct or rearranged output signal of the local channel oscillator are supplied to a reception mixer so that the intermediate frequency corresponds to the baseband.

10. The transceiver as claimed in claim 5, wherein the modulated output signal of the IF oscillator and the output signal of a transmission mixer are fed to a phase discriminator, to which a signal of a controlled transmission oscillator and an output signal of the local channel oscillator are supplied.

* * * * *